(12) United States Patent
Maetani

(10) Patent No.: US 10,826,308 B2
(45) Date of Patent: Nov. 3, 2020

(54) CHARGE/DISCHARGE CONTROL DEVICE AND BATTERY APPARATUS

(71) Applicant: ABLIC Inc., Chiba-shi, Chiba (JP)

(72) Inventor: Fumihiko Maetani, Chiba (JP)

(73) Assignee: ABLIC INC., Chiba (JP)

(*) Notice: Subject to any disclaimer, the term of this patent is extended or adjusted under 35 U.S.C. 154(b) by 176 days.

(21) Appl. No.: 16/210,356

(22) Filed: Dec. 5, 2018

(65) Prior Publication Data

US 2019/0173297 A1 Jun. 6, 2019

(30) Foreign Application Priority Data

Dec. 6, 2017 (JP) .................................. 2017-233950

(51) Int. Cl.
| | | |
|---|---|---|
| *H02J 7/00* | (2006.01) | |
| *G01R 31/382* | (2019.01) | |
| *H01L 27/085* | (2006.01) | |
| *G01R 19/165* | (2006.01) | |

(52) U.S. Cl.
CPC ...... *H02J 7/0029* (2013.01); *G01R 19/16519* (2013.01); *G01R 31/382* (2019.01); *H01L 27/085* (2013.01); *H02J 7/00306* (2020.01); *H02J 7/00304* (2020.01)

(58) Field of Classification Search
CPC .... H02J 7/0026; H02J 7/0029; H02J 7/00304; H02J 7/00306; G01R 19/16519
USPC .......................................................... 716/134
See application file for complete search history.

(56) References Cited

U.S. PATENT DOCUMENTS

| | | | |
|---|---|---|---|
| 2014/0125289 A1 | 5/2014 | Tonomura et al. | |
| 2017/0201104 A1* | 7/2017 | Jin | ........................ H02J 7/0029 |

FOREIGN PATENT DOCUMENTS

| | | |
|---|---|---|
| JP | 2009-131020 A | 6/2009 |
| JP | 2014-96907 A | 5/2014 |

* cited by examiner

*Primary Examiner* — Paul Dinh
(74) *Attorney, Agent, or Firm* — Brinks Gilson & Lione

(57) ABSTRACT

A charge/discharge control device and a battery apparatus respectively include a discharging-overcurrent-detection circuit which monitors a discharging overcurrent according to a discharging-overcurrent-reference voltage based on the voltage of a discharging-overcurrent-detection terminal, and the voltage of a discharge-reference FET having a drain and a gate connected to those of a charge control FET.

6 Claims, 3 Drawing Sheets

CHARGE/DISCHARGE CONTROL DEVICE AND BATTERY APPARATUS

RELATED APPLICATIONS

This application claims priority under 35 U.S.C. § 119 to Japanese Patent Application No. 2017-233950 filed on Dec. 6, 2017, the entire content of which is hereby incorporated by reference.

BACKGROUND OF THE INVENTION

1. Field of the Invention

The present invention relates to a charge/discharge control device and a battery apparatus.

2. Description of the Related Art

FIG. 3 illustrates a block diagram of a related art battery apparatus. The related art battery apparatus includes a secondary battery 1, an overcharge-detection circuit 31, an over discharge-detection circuit 32, a charge control circuit 33, a discharge control circuit 34, a reference-current circuit 37, a comparator 38, a charging FET (Q1), a discharging FET (Q2), a first reference FET (Q3), a second reference FET (Q4), and external terminals T1 and T2.

The reference-current circuit 37 makes a reference current flow through the first reference FET (Q3) and the second reference FET (Q4) to generate an overcurrent-detection voltage at a source of the first reference FET (Q3). The comparator 38 compares a voltage based on a discharging current generated in each of the charging FET (Q1) and the discharging FET (Q2) and the overcurrent-detection voltage to detect a discharging overcurrent of the battery apparatus.

Here, the first reference FET (Q3) and the second reference FET (Q4) have the same temperature characteristics and source-gate voltage characteristics as those of the charging FET (Q1) and the discharging FET (Q2) respectively. The battery apparatus constructed in this manner is capable of reliably compensating for influences due to a variation in temperature and a fluctuation in the voltage of the secondary battery 1 and detecting an overcurrent with high accuracy (refer to, for example, Japanese Patent Application Laid-Open No. 2009-131020).

SUMMARY OF THE INVENTION

The battery apparatus may adopt MOSFETs each having a trench structure in order to lower the on-resistances of the charging FET (Q1) and the discharging FET (Q2). In this case, if the MOSFETs each having the trench structure are also used to constitute the first reference FET (Q3) and the second reference FET (Q4) on the same semiconductor chip, the drain of the first reference FET (Q3) and the second reference FET (Q4) should be separated from the drain of the charging FET (Q1) and the discharging FET (Q2). But due to the restriction on the trench structure that the drains are all connected to form a common drain, it is difficult to construct the battery apparatus as shown in the circuit of FIG. 3.

The present invention provides a charge/discharge control device and a battery apparatus capable of reliably compensating for influences due to the variation in temperature and the fluctuation in the voltage of the secondary battery 1 and detecting the overcurrent with high accuracy even if the charging FET (Q1) and the discharging FET (Q2) are constructed from vertical MOSFETs each having a trench structure or the like.

According to an aspect of the present invention there is provided a charge/discharge control device which monitors a voltage and a current of a secondary battery to control charging/discharging of the secondary battery, including: a first external terminal connected to one end of the secondary battery; a second external terminal; a charge control FET and a discharge control FET connected between the other end of the secondary battery and the second external terminal and have drains connected to each other; a discharge-reference FET having a drain connected to the drain of the charge control FET and having a gate connected to a gate of the charge control FET; and a charge/discharge control circuit having a first power-supply terminal to which the one end of the secondary battery is connected, a second power-supply terminal to which the other end of the secondary battery and a source of the discharge control FET are connected, a charge control terminal to which the gate of the charge control FET is connected, a discharge control terminal to which a gate of the discharge control FET is connected, a discharging-overcurrent-reference terminal to which a source of the discharge-reference FET is connected, and a discharging-overcurrent-detection terminal to which a source of the charge control FET is connected, the charge/discharge control circuit including a discharging-overcurrent-detection circuit configured to monitor a discharging overcurrent according to a discharging-overcurrent-reference voltage based on a voltage of the discharging-overcurrent-reference terminal and a voltage of the discharging-overcurrent-detection terminal, and a control circuit configured to output a signal which controls the discharge control FET according to a signal of the discharging-overcurrent-detection circuit.

According to the charge/discharge control device of the present invention, even if a vertical MOSFET is adopted for a charge/discharge control FET, a vertical MOSFET having a similar structure can be used to constitute a discharge-reference FET. It is therefore possible to reliably compensate for influences due to the variation in temperature and the fluctuation in the voltage of a secondary battery and detect an overcurrent with high accuracy. It is thus possible to provide a battery apparatus capable of detecting an overcurrent at high accuracy.

DETAILED DESCRIPTION OF THE PREFERRED EMBODIMENTS

Embodiments of the present invention will hereinafter be described with reference to the accompanying drawings.

Figure 1:
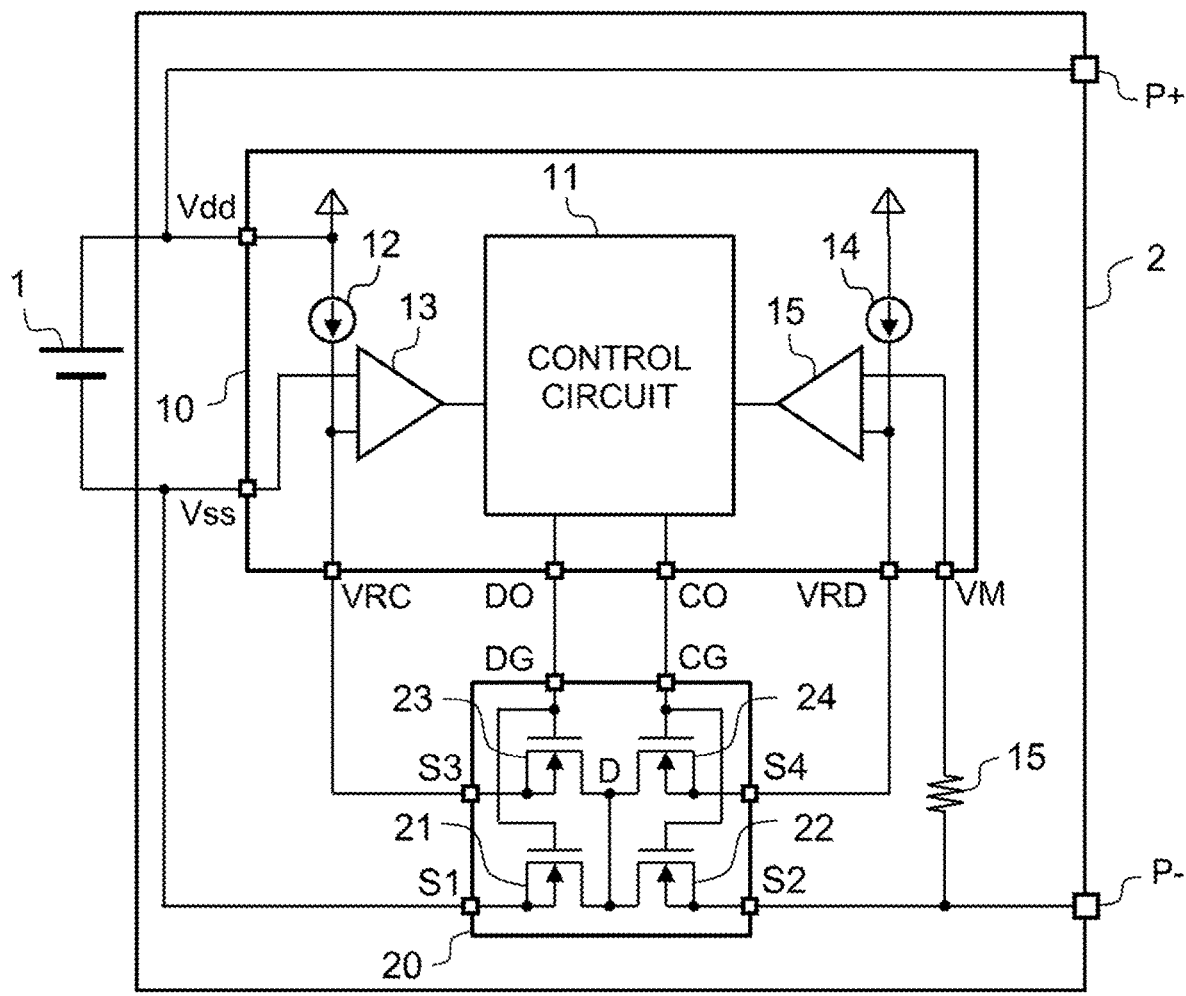
FIG. 1 is a block diagram illustrating a battery apparatus according to an embodiment of the present invention.

FIG. 1 is a block diagram illustrating a battery apparatus 100 according to an embodiment of the present invention. The battery apparatus 100 includes a secondary battery 1, and a charge/discharge control device 2. The charge/discharge control device 2 includes a charge/discharge control circuit 10, an FET circuit 20, and external terminals P+ and P−.

The secondary battery 1 has a positive terminal connected to the external terminal P+. The charge/discharge control circuit 10 has a first power-supply terminal Vdd connected to the positive terminal of the secondary battery 1, a second power-supply terminal Vss connected to a negative terminal of the secondary battery 1, a charge control terminal CO connected to a terminal CG of the FET circuit 20, a discharge control terminal DO connected to a terminal DG of the FET circuit 20, a discharging-overcurrent-detection terminal VM connected to a terminal S2 of the FET circuit 20 through a resistor 15, a charging-overcurrent-reference terminal VRC connected to a terminal S3 of the FET circuit 20, and a discharging-overcurrent-reference terminal VRD connected to a terminal S4 of the FET circuit 20. The FET circuit 20 has a terminal S1 connected to the negative terminal of the secondary battery 1, and the terminal S2 connected to the external terminal P−.

The charge/discharge control circuit 10 includes a control circuit 11, constant current circuits 12 and 14, and comparison circuits 13 and 15. The constant current circuit 12 is connected between the first power-supply terminal Vdd and the charging-overcurrent-reference terminal VRC. The constant current circuit 14 is connected between the first power-supply terminal Vdd and the discharging-overcurrent-reference terminal VRD. The comparison circuit 13 has a first input terminal connected to the second power-supply terminal Vss, a second input terminal connected to the charging-overcurrent-reference terminal VRC, and an output terminal connected to the control circuit 11. The comparison circuit 15 has a first input terminal connected to the discharging-overcurrent-detection terminal VM, a second input terminal connected to the discharging-overcurrent-reference terminal VRD, and an output terminal connected to the control circuit 11.

The constant current circuit 12 and the comparison circuit 13 constitute a charging-overcurrent-detection circuit which monitors a charging overcurrent. The constant current circuit 14 and the comparison circuit 15 constitute a discharging-overcurrent-detection circuit which monitors a discharging overcurrent.

The FET circuit 20 includes a discharge control FET21, a charge control FET22, a charge-reference FET23, and a discharge-reference FET24. The discharge control FET21 has a source connected to the terminal S1, and a gate connected to the terminal DG. The charge control FET22 has a source connected to the terminal S2, and a gate connected to the terminal CG. The charge-reference FET23 has a source connected to the terminal S3, and a gate connected to the terminal DG. The discharge-reference FET24 has a source connected to the terminal S4, and a gate connected to the terminal CG. All the FETs have drains connected in common (referred to as a node D).

Here, the discharge control FET21 and the charge control FET22 are constructed from MOSFETs each having a trench structure to lower their on-resistances. Also, the charge-reference FET23 and the discharge-reference FET24 are constructed from MOSFETs each having a trench structure to fit their characteristics with those of the discharge control FET21 and the charge control FET22. Further, the ratio between the channel widths of the charge-reference FET23 and the discharge control FET21 is assumed to be set at 1:1000000, and the ratio between the current of the constant current circuit 12 and the charging overcurrent is also assumed to be similar accordingly. The same applies to the discharging overcurrent too.

The operation of the battery apparatus 100 constructed as described above will next be described.

When the voltage of the secondary battery 1 is higher than the over discharge voltage and lower than the overcharge voltage, the control circuit 11 outputs a high-level signal from the charge control terminal CO and the discharge control terminal DO. The discharge control FET21 and the charge control FET22 are turned on because the high-level signal is applied to their gates through the terminals DG and CG. The charge-reference FET23 and the discharge-reference FET24 are similarly turned on because their gates are in common with those of the discharge control FET21 and the charge control FET22.

The voltage of the charging-overcurrent-reference terminal VRC becomes a charging-overcurrent-reference voltage based on the on-resistance of the charge-reference FET23 with the node D as the reference, and the current of the constant current circuit 12. The voltage of the second power-supply terminal Vss becomes a voltage based on the on resistance of the discharge control FET21 with the node D as the reference, and a charging current of an unillustrated charger connected to the first external terminal P+ and the second external terminal P−.

The comparison circuit 13 monitors a charging overcurrent according to the voltage of the second power supply-terminal Vss which is supplied to the first input terminal thereof, and the voltage of the charging-overcurrent-reference terminal VRC which is supplied to the second input terminal thereof. That is, the voltage of the second power-supply terminal Vss exceeds the voltage of the charging-overcurrent-reference terminal VRC, then the comparison circuit 13 detects a charging overcurrent and outputs a charging-overcurrent-detection signal.

The voltage of the discharging-overcurrent-reference terminal VRD becomes a discharging-overcurrent-reference voltage based on the on resistance of the discharge-reference FET24 with the node D as the reference, and the current of the constant current circuit 14. The voltage of the discharging-overcurrent-detection terminal VM becomes a voltage based on the on resistance of the charge control FET22 with the node D as the reference, and a discharging current flowing through an unillustrated load connected to the first external terminal P+ and the second external terminal P−.

The comparison circuit 15 monitors a discharging overcurrent according to the voltage of the discharging-overcurrent-detection terminal VM, which is supplied to the first input terminal thereof, and the voltage of the discharging-overcurrent-reference terminal VRD, which is supplied to the second input terminal thereof. That is, the voltage of the discharging-overcurrent-detection terminal VM exceeds the voltage of the discharging-overcurrent-reference terminal VRD, then the comparison circuit 15 detects a discharging overcurrent and outputs a discharging-overcurrent-detection signal.

Here, since the charge-reference FET23 and the discharge-reference FET24 are constructed from MOSFETs each having a trench structure and characteristics similar to those of the discharge control FET21 and the charge control FET22, it is possible to reliably compensate for influences due to the variation in temperature and the fluctuation in the voltage of the secondary battery and detect an overcurrent at high accuracy.

Further, the FET circuit 20 may be formed on a semiconductor substrate different from that of the charge/discharge control circuit 10 which requires no trench structure. That is, the charge/discharge control device 2 is constructed from a semiconductor device including the charge/discharge control circuit 10 and a semiconductor device including the FET circuit 20. This construction enables the manufacturing cost of the charge/discharge control device 2 to be suppressed low.

Figure 2:
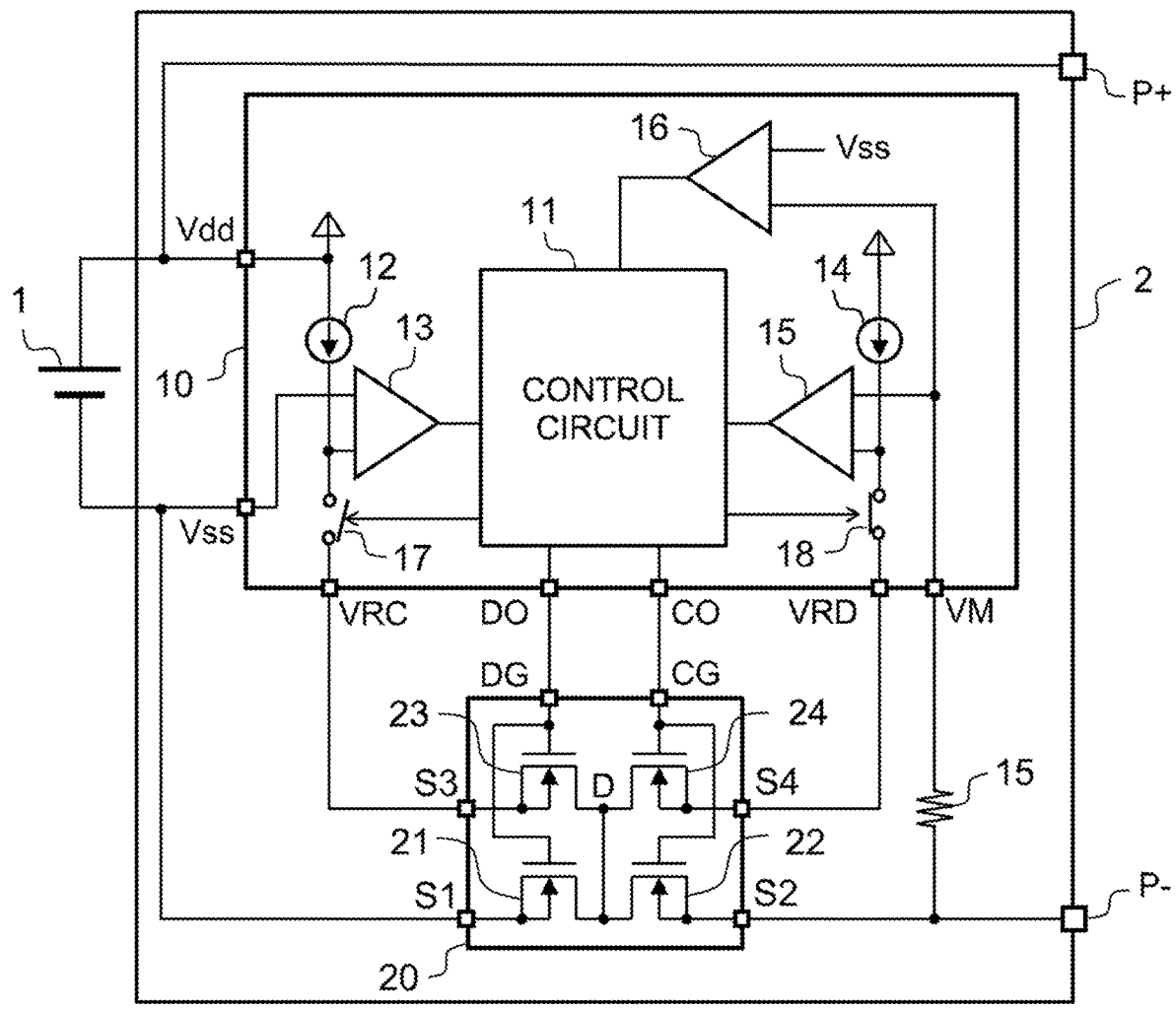
FIG. 2 is a block diagram illustrating another example of the battery apparatus according to the present embodiment.
Figure 3:
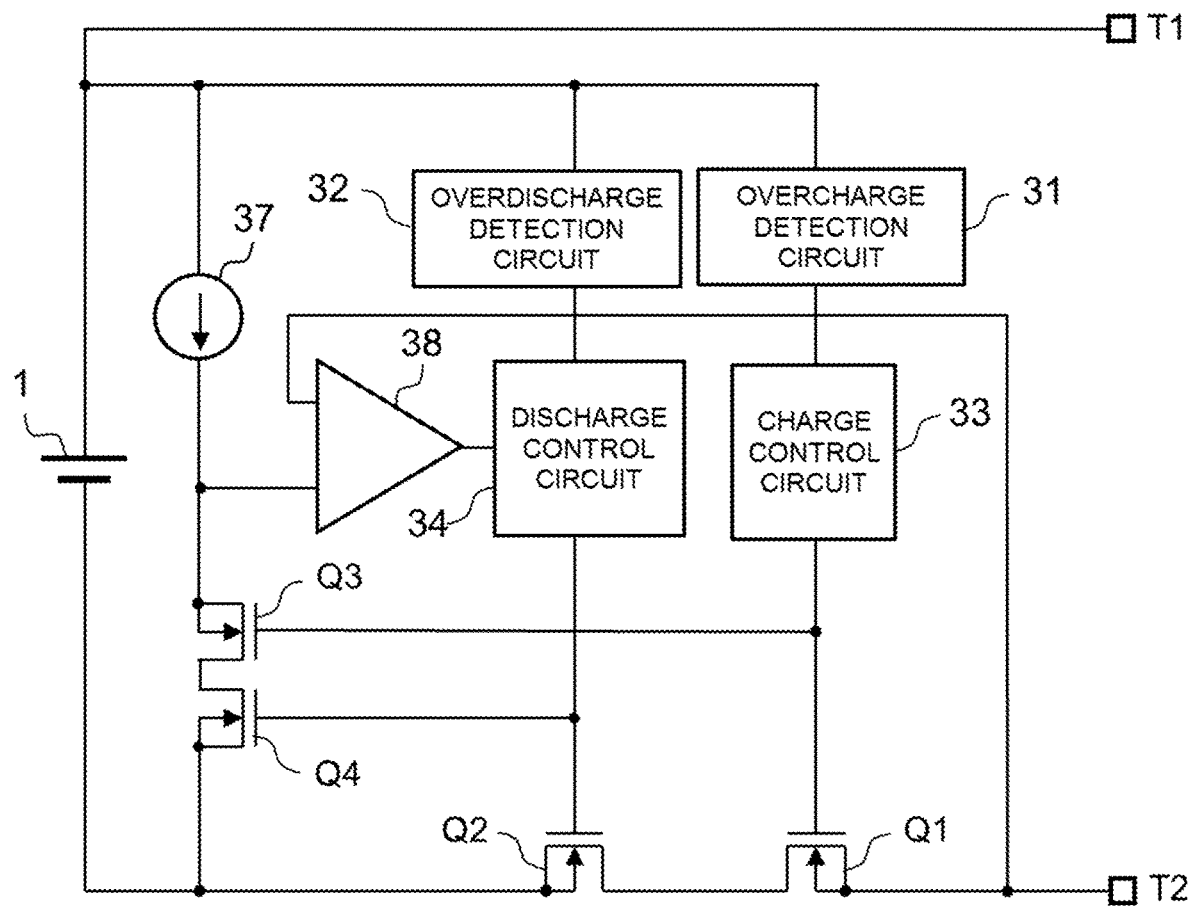
FIG. 3 is a block diagram illustrating a related art battery apparatus.

FIG. 2 is a block diagram illustrating another example of the battery apparatus 100 according to the present embodiment.

A charge/discharge control circuit 10 includes a discharging-overcurrent-detection circuit and a charging-overcurrent-detection circuit respectively equipped with constant current circuits 12 and 14. The battery apparatus 100 illustrated in FIG. 2 is an effective example of a circuit where lowering of current consumption is required.

The charge/discharge control circuit 10 illustrated in FIG. 2 includes a comparison circuit 16 which compares the voltage of a discharging-overcurrent-detection terminal VM and the voltage of a second power-supply terminal Vss, a switch 17 connected between the constant current circuit 12 and a charging-overcurrent-reference terminal VRC, and a switch 18 connected between the constant current circuit 14 and a discharging-overcurrent-reference terminal VRD.

The comparison circuit 16 detects that a secondary battery 1 is being charged and outputs a charging-current-detection signal to a control circuit 11 since the voltage of the discharging-overcurrent-detection terminal VM becomes lower than the voltage of the power-supply terminal Vss by the flow of charging current caused by the connection of a charger between the first external terminal P+ and the second external terminal P−. The control circuit 11 outputs a control signal to the switches 17 and 18 according to the charging-current-detection signal. That is, when the charging current flows, the switch 17 is turned on, and the switch 18 is turned off to detect a charging overcurrent. When no charging current flows, the switch 17 is turned off, and the switch 18 is turned on to detect a discharging overcurrent. Thus, the charge/discharge control circuit 10 illustrated in FIG. 2 is capable of reducing current consumption because only the current of either the constant current circuit 12 or the constant current circuit 14 flows.

Incidentally, in FIG. 2, the switches 17 and 18 may be connected to any of current paths of the constant current circuit 12 and the constant current circuit 14 without being limited to those in the charge/discharge control circuit. Further, a common constant current circuit may be switched by a switch to make a current flow through the discharging-overcurrent-detection circuit or the charging-overcurrent-detection circuit.

Although the embodiments of the present invention have been described above, the present invention is not limited to the above embodiments. It is needless to say that various changes can be made thereto within the scope not departing from the spirit of the present invention.

For example, although the embodiment shown above has described the configurational example in which both the discharging overcurrent and the charging overcurrent are detected, a configuration in which only the discharging overcurrent or only the charging overcurrent is detected is also permitted. Further, for example, although the embodiment shown above has described the example in which P channel FETs are used as the FET circuit 20, it is also possible to use a circuit configuration in which N channel FETs are used to invert its logic.

What is claimed is:

1. A charge/discharge control device monitoring a voltage and a current of a secondary battery to control charging/discharging of the secondary battery, comprising:
   a first external terminal connected to one end of the secondary battery;
   a second external terminal;
   a charge control FET and a discharge control FET connected between the other end of the secondary battery and the second external terminal and have drains connected to each other;
   a discharge-reference FET having a drain connected to the drain of the charge control FET and having a gate connected to a gate of the charge control FET; and
   a charge/discharge control circuit having a first power-supply terminal to which the one end of the secondary battery is connected, a second power-supply terminal to which the other end of the secondary battery and a source of the discharge control FET are connected, a charge control terminal to which the gate of the charge control FET is connected, a discharge control terminal to which a gate of the discharge control FET is connected, a discharging-overcurrent-reference terminal to which a source of the discharge-reference FET is connected, and a discharging-overcurrent-detection terminal to which a source of the charge control FET is connected, the charge/discharge control circuit comprising a discharging-overcurrent-detection circuit configured to monitor a discharging overcurrent according to a discharging-overcurrent-reference voltage based on a voltage of the discharging-overcurrent-reference terminal and a voltage of the discharging-overcurrent-detection terminal, and a control circuit configured to output a signal which controls the discharge control FET according to a signal of the discharging-overcurrent-detection circuit.

2. The charge/discharge control device according to claim 1:
   wherein the charge/discharge control device includes a charge-reference FET configured to have a drain connected to the drain of the discharge control FET, and a gate connected to the gate of the discharge control FET;
   wherein the charge/discharge control circuit includes a charging-overcurrent-reference terminal to which a source of the charge-reference FET is connected, and a charging-overcurrent-detection circuit configured to monitor a charging overcurrent according to a charging-overcurrent-reference voltage based on a voltage of the charging-overcurrent-reference terminal and a voltage of the second power-supply terminal; and
   wherein the control circuit is configured to output a signal which controls the charge control FET according to a signal of the charging-overcurrent-detection circuit.

3. The charge/discharge control device according to claim 2, wherein the charge control FET, the discharge control FET, the discharge-reference FET, and the charge-reference FET are vertical MOSFETs.

4. The charge/discharge control device according to claim 3, wherein the charge control FET, the discharge control FET, the discharge-reference FET, and the charge-reference FET are formed on a semiconductor substrate different from that of the charge/discharge control circuit.

5. The charge/discharge control device according to claim 2, wherein the charge/discharge control circuit includes a comparison circuit configured to compare the voltage of the discharging-overcurrent-reference terminal and the voltage of the second power-supply terminal and output a charging-current detection-signal to the control circuit in response to a detection of a charging current flow between the first external terminal and the second external terminal, and
wherein the control circuit switches a current path of the discharging-overcurrent-detection circuit and a current path of the charging-overcurrent-detection circuit according to the charging-current-detection signal.

6. A battery apparatus comprising:
a secondary battery; and
the charge/discharge control device according to claim 1.

* * * * *